(12) United States Patent
Ullmann et al.

(10) Patent No.: US 9,885,768 B2
(45) Date of Patent: Feb. 6, 2018

(54) METHOD FOR GENERATING A DESIRED SPATIALLY VARIABLE TEMPORAL PROFILE OF THE MAGNETIZATION STATE IN MAGNETIC RESONANCE

(75) Inventors: Peter Ullmann, Karlsruhe (DE);
Johannes Schneider, Karlsruhe (DE);
Wolfgang Ruhm, Ettlingen (DE)

(73) Assignee: Bruker BioSpin MRI GmbH, Ettingen (DE)

( * ) Notice: Subject to any disclaimer, the term of this patent is extended or adjusted under 35 U.S.C. 154(b) by 1137 days.

(21) Appl. No.: 14/009,113

(22) PCT Filed: Apr. 18, 2012

(86) PCT No.: PCT/EP2012/057036
§ 371 (c)(1),
(2), (4) Date: Jul. 3, 2014

(87) PCT Pub. No.: WO2012/143368
PCT Pub. Date: Oct. 26, 2012

(65) Prior Publication Data
US 2014/0312898 A1    Oct. 23, 2014

(30) Foreign Application Priority Data
Apr. 20, 2011 (DE) .................... 10 2011 007 823

(51) Int. Cl.
*G01V 3/00*     (2006.01)
*G01R 33/44*    (2006.01)
*G01R 33/561*   (2006.01)

(52) U.S. Cl.
CPC ....... *G01R 33/443* (2013.01); *G01R 33/5612* (2013.01); *G01R 33/5614* (2013.01)

(58) Field of Classification Search
CPC .................................................. G01R 33/5614
(Continued)

(56) References Cited

U.S. PATENT DOCUMENTS 7,466,131 B1 * 12/2008 Xu ............... G01R 33/4824
                                                     324/318
7,705,594 B2 *  4/2010 Xu ............... G01R 33/4833
                                                     324/307
(Continued)

FOREIGN PATENT DOCUMENTS

DE    10 2008 021 736    12/2009
DE    10 2008 029 175    12/2009
(Continued)

OTHER PUBLICATIONS

M. Haas et al., "T2*-compensated Transmit SENSE RF pulses", Proc. Intl. Soc. Mag. Reson. Med. 17 (2009).
(Continued)

*Primary Examiner* — Louis Arana
(74) *Attorney, Agent, or Firm* — Paul Vincent

(57) ABSTRACT

A method for generating a desired temporal profile of the magnetization state in an object under examination (O) during an experiment involving magnetic resonance is characterized in that at least one spatially dependent change in the magnetization state inside the object under examination (O) is predefined and spatially selective radio-frequency pulses, which allow a simultaneous and independent change in the magnetization state at locations with different stipulations, are irradiated in order to implement the predefined spatially dependent change in the magnetization state. The method permits establishment of the same desired temporal profile of the magnetization state for different regions of the object under examination despite different given experimental parameters or deliberate generation of different desired profiles of the magnetization state at different locations.

7 Claims, 5 Drawing Sheets

(58) Field of Classification Search
USPC .................................. 324/314, 309, 307, 306
See application file for complete search history.

(56) References Cited

U.S. PATENT DOCUMENTS

| | | | | |
|---|---|---|---|---|
| 8,063,637 | B2* | 11/2011 | Xu | ..................... G01R 33/5612 324/314 |
| 8,938,281 | B2* | 1/2015 | Fuderer | .............. G01R 33/5612 600/407 |
| 9,194,923 | B2* | 11/2015 | Yokosawa | .............. A61B 5/055 |
| 2004/0222794 | A1 | 11/2004 | Griswold | |
| 2010/0237862 | A1 | 9/2010 | Griswold | |
| 2010/0264926 | A1 | 10/2010 | Xu | |
| 2011/0210732 | A1* | 9/2011 | Worters | ............. G01R 33/5614 324/309 |

FOREIGN PATENT DOCUMENTS

| | | |
|---|---|---|
| DE | 10 2008 039 203 | 2/2010 |
| DE | 10 2008 061 455 | 6/2010 |
| DE | 10 2009 025 476 | 1/2011 |
| WO | WO 2010/112941 | 10/2010 |

OTHER PUBLICATIONS

Nicolas Boulant, "$T_1$ and $T_2$ effects during radio-frequency pulses in spoiled gradient echo sequences", Journal of Magnetic Resonance 197 (2009), vol. 213-218.

W. Ruhm et al., "Multidimensional Spatial Encoding by Parallel Excitation", Proc. Intl. Soc. Mag. Reson. Med. 16 (2008).

W.Grissom et al., "Spatial Domain Method for the Design of RF Pulses in Multicoil Parallel Excitation", Magnetic Resonance in Medicine 56:620-629 (2006).

* cited by examiner

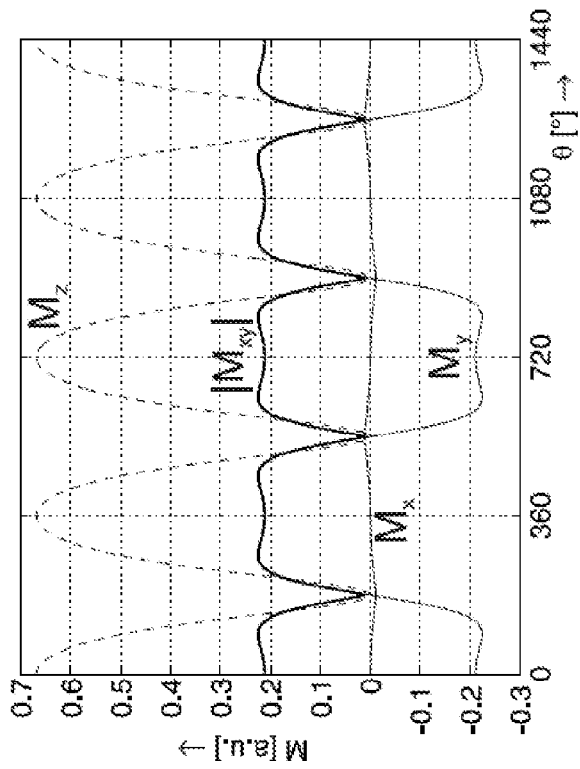
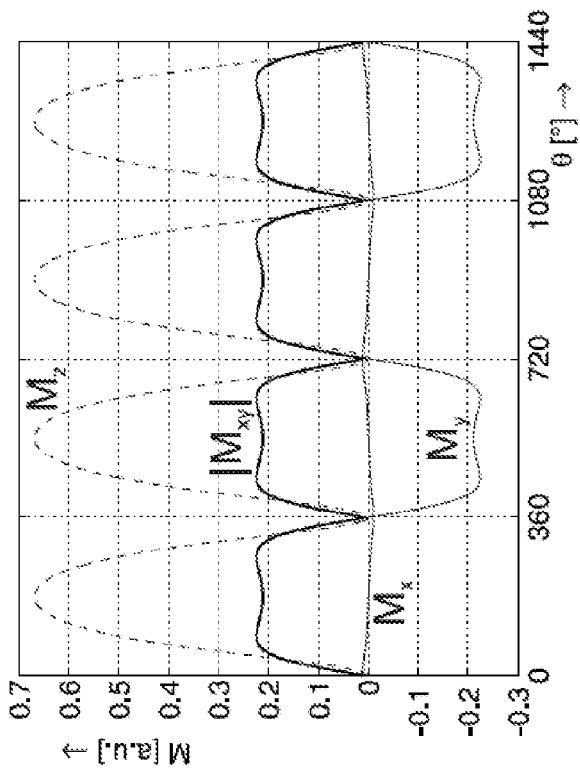
Fig. 5

METHOD FOR GENERATING A DESIRED SPATIALLY VARIABLE TEMPORAL PROFILE OF THE MAGNETIZATION STATE IN MAGNETIC RESONANCE

This application is the national stage of PCT/EP2012/057036 filed on Apr. 18, 2012 and also claims Paris convention priority from DE 10 2011 007 823.1 filed Apr. 20, 2011.

BACKGROUND OF THE INVENTION

The invention concerns a method for generating a desired temporal profile of the magnetization state in an object under examination during an experiment involving magnetic resonance, wherein, during the experiment, the magnetization state is changed several times by means of radio-frequency pulses (RF pulses), and wherein at least one sequence parameter, which influences the development of the magnetization state between applications of radio-frequency pulses, is determined in advance.

Such a method is known, for example, from Reference [1].

Magnetic resonance imaging (MRI), also termed magnetic resonance tomography (MRT), is a widespread technique for non-invasive acquisition of images of the interior of an object under examination and is based on the spatially resolved measurement of magnetic resonance signals from the object under examination. By subjecting the object under examination within the measurement volume of a magnetic resonance measurement apparatus to an essentially static and homogenous magnetic basic field, also termed the main magnetic field, nuclear spins contained in it are oriented in the direction of the basic field, usually selected as the z-direction of a magnet-bound coordinate system. The associated orientation of the magnetic dipole moments of the atomic nuclei results in magnetization within the object in the direction of the main magnetic field, which is termed longitudinal magnetization. In the case of an MR examination (MR: magnetic resonance), irradiation of electromagnetic RF pulses (RF: radio frequency) by means of one or more RF transmission elements of a transmission antenna device excites this magnetization within the object under examination to effect precession movements whose frequencies are proportional to the local magnetic field strength. The vector of magnetization is deflected from the steady state position (z-direction) by an angle hereinafter referred to as the flip angle.

In the MRI methods in use today, spatial encoding is imposed on the precession movements of the nuclear spins for all three spatial directions by time-variable superposition of additional location-dependent magnetic fields, hereinafter referred to as additional magnetic fields. These additional magnetic fields usually exhibit essentially constant gradients of the z-components in the spatial directions x, y, and z within the object under examination and are generated by a coil configuration, termed a gradient system, that is controlled by one gradient channel for each spatial direction. However, for some years, various imaging techniques have existed, which also use non-linear additional magnetic fields with spatially varying gradients. Unless stated otherwise, where magnetic fields are described hereinafter as linear or non-linear, this always refers to the spatial profile of the z-component of the fields. Spatial encoding is usually described according to a scheme in a space, called k-space, that is conjugated to real space by means of a Fourier transformation. In this k-space formalism, which can only be applied to the use of magnetic fields with gradients that are constant in space, it is possible to describe the switching of additional magnetic field pulses as a progression along a trajectory in k-space, termed the k-space trajectory.

The transverse component of the precessing magnetization associated with the nuclear spins, hereinafter also referred to as transverse magnetization, induces electrical voltage signals, which are also called magnetic resonance signals (MR signals), in one or more RF reception antennas, which surround the object under examination. By means of pulse sequences that contain specially selected sequences of RF pulses and additional magnetic field pulses (brief application of additional magnetic fields that are constant or variable over time), time-variable magnetic resonance signals are generated in such a way that they can be converted to the corresponding spatial representations. This is done according to one of many well-known reconstruction techniques after the MR signals have been acquired, amplified, and digitized using an electronic reception system, processed using an electronic computer system, and stored in one-dimensional or mufti-dimensional data sets. The pulse sequence used typically contains a sequence of measurement operations, termed spatial encoding steps, in which the gradient pulses are varied according to the chosen spatial encoding method.

Such an MRI method can therefore be summarized as follows: the magnetization, which is initially in thermal equilibrium in the object under examination, is influenced by the application of RF pulses and additional magnetic fields, resulting in a temporal profile of the magnetization states, which is determined by the Bloch equations and which, by the targeted selection of the applied RF pulses and additional magnetic fields, can be set according to a desired profile within certain physical limits. Such limits are, for example, that the profile can only be actively influenced while the RF pulses and additional magnetic fields are being applied. At other times, the magnetization state develops depending on other parameters of the experiment according to the Bloch equations. This development of magnetization over time will then, as already described above, be detected at suitable times by means of the reception system.

The simplest type of measurement sequence for generating an MR image starting from thermal equilibrium is to tilt the magnetization oriented in the longitudinal direction into the transverse plane through a specific angle with a radio-frequency excitation pulse, to perform spatial encoding by means of the additional magnetic fields and to acquire the MR signal. Before irradiation of the next excitation pulse, time is then allowed to elapse until the transverse magnetization has decayed as a result of the so-called relaxation mechanisms, and steady state magnetization is built up again in the longitudinal direction. A drawback of this type of imaging is the very long measurement times due to the often relatively long longitudinal relaxation time, as there is a limit to the permissible brevity of the time between two consecutive excitations, the so-called repetition time. To try to solve this problem, many MR sequences have been developed that perform imaging in a so-called "steady state." In this case, the magnetization between two consecutive RF pulses is not allowed to fully relax, but the next excitation is executed with reduced longitudinal magnetization and while transverse magnetization still exists. In this way, after each RF pulse, a different temporal profile of magnetization results until a so-called dynamic equilibrium (steady state) is reached, in dependence on the state of magnetization before the RF pulse. MR signal acquisition is usually performed in this dynamic steady state. This method offers many advantages. For instance, by skillful selection of sequence parameters based on the given experimental parameters, a sufficient MR signal can be acquired despite short repetition times. In this context, sequence parameters are the parameters of the experiment that can usually be freely selected within certain limits when setting up an individual experiment. Some of these many parameters include application time, amplitudes, and durations of the applied additional magnetic fields and application time, amplitudes, phases, durations, and frequencies of the irradiated radio-frequency pulses as well as extent, application times, and durations of signal acquisition. Parameters that are defined by the apparatus characteristics, which cannot usually be altered for every experiment or by the physical characteristics of the object under examination, are referred to as given experimental parameters. Examples of these are the strength and homogeneity of the basic magnetic field, characteristics of the transmission and reception antenna device, characteristics of the object, such as relaxation behavior and susceptibility distributions, and many more. Furthermore, by specific adjustment of the sequence parameters to the given experimental conditions (system characteristics, object characteristics), various characteristics of the MR signal can be influenced and specific mapping contrasts achieved. Overall therefore, considerably more degrees of freedom for shaping the MR signal are available than for sequences that execute an excitation from thermal equilibrium within each repetition and subsequently allow the system to relax again to thermal equilibrium.

In principle, in such sequences that do not allow magnetization to fully relax again after each excitation, signal acquisition can be performed before a steady state has been reached, i.e. in the transient phase of the temporal magnetization profile. This fact may then possibly have to be taken into account in signal evaluation or image reconstruction. Equally, an alternating or irregular profile of the magnetization state may also occur. Here, too, sequence and given experimental parameters play a decisive role.

Within the scope of this description, the background and object of the invention as well as the explanation of the inventive method will largely be explained using the example of a steady-state sequence. The inventive method can, however, be used in many sequences in which a desired transient profile of the magnetization state is produced across multiple RF pulses, which never reaches the steady state and during which MR signals may be acquired. An example of this would be a so-called multi-spin echo sequence in which, after an excitation pulse, an echo train made up of several spin echoes is generated with several consecutive refocusing pulses, and in which, for example, the profile of the magnetization state during the echo train can be specifically influenced with certain characteristics of the refocusing pulses, such as the pulse phase.

In prior art steady-state sequences, the sequence parameters are always selected and applied globally to the entire object under examination or to a single subvolume to be selected, for example, a slice. If the object under examination is not located entirely inside the active volume of the transmission antenna device, within the scope of this description the term object under examination will only designate that part of the object that is located inside this active volume. Due to the spatial variability of the given experimental parameters in the object under examination, this global application does not ensure that the desired steady state will be reached at every location. Conversely, it is not possible to achieve different steady states at locations at which identical given experimental and sequence parameters have an effect or are applied.

It is therefore the object of this invention to present a method with which the same desired temporal profile of the magnetization state can be set for different regions of the object under examination despite differing given experimental parameters, or, if it is advantageous, to deliberately effect different desired profiles of the magnetization state at different locations.

SUMMARY OF THE INVENTION

This object is inventively achieved by a method according to the independent claim.

According to the invention, a change in the magnetization state effected by an RF pulse injected in the sequence is not selected globally for the entire volume under examination, rather the magnetization at different locations of the object under examination is changed in different ways by means of a spatially selective pulse. To differentiate more easily between the terms used, hereinafter these spatially selective pulses will no longer be considered sequence parameters but will be considered separately.

In the inventive method, a desired temporal profile of the magnetization state is produced in an object under examination during an experiment involving magnetic resonance, wherein, during the experiment, the magnetization state is changed several times by means of radio-frequency pulses, and wherein at least one sequence parameter, which influences the development of the magnetization state between two applications of radio-frequency pulses, is determined in advance. In this way, the type and extent of the influence of the parameter(s) on the development of the magnetization state is determined. Unlike in known methods, according to the invention, at least one spatially dependent change in the magnetization state inside the object under examination is predefined, which change should be produced by a radio-frequency pulse, depends on at least one of the parameters determined, is different at at least two locations, and is different from zero at these locations, and spatially selective radio-frequency pulses, that is to say radio-frequency pulses, which allow a simultaneous and independent change in the magnetization state at locations with different stipulations, are irradiated in order to implement the predefined spatially dependent change in the magnetization state.

By inventively considering the sequence parameters stated above in the stipulation of the changes in magnetization to be generated by the RF pulses, a desired temporal profile of the magnetization distribution can be set.

Variants as well as further advantageous characteristics and embodiments of the invention are described below.

In an especially advantageous variant of the inventive method, the radio-frequency pulses are combined with spatially and temporally varying additional magnetic fields, which are superimposed on the static and homogenous magnetic basic field of a magnetic resonance measurement apparatus. The use of additional magnetic fields is one of several variants for providing the radio-frequency pulses with spatial selectivity.

A further especially advantageous variant of the inventive method applies the radio-frequency pulses using more than one transmission element of a transmission antenna device. The use of a plurality of transmission elements is another variant for providing the radio-frequency pulses with spatial selectivity.

In a very useful variant of the inventive method the stipulations for changing the magnetization state are selected such that the temporal profile of the magnetization state reaches a dynamic equilibrium (steady state).

In further variants, the inventive method is used in experiments of magnetic resonance imaging and/or magnetic resonance spectroscopy.

In conventional methods for producing a desired profile of the magnetization state in an object under examination during a magnetic resonance experiment, radio-frequency pulses are usually set that change the magnetization in the same way in the entire examination volume or in an individually selected subvolume (e.g. a slice), i.e. at all the locations at which the magnetization was in the same state before the pulse, it is also in the same state after the pulse. By applying RF pulses with a transmission antenna device that applies the RF pules with a certain field distribution, spatial differences in the magnetization change can result, in conventional methods they are however dependent on each other and closely linked to each other by the given transmission distribution.

In the inventive method, this paradigm is broken down and spatially selective radio-frequency pulses are used that make it possible to implement spatially dependent change in the magnetization state, i.e. to change the magnetization state at different locations in the object simultaneously and independently. In this way, it is now possible for different locations in the object to independently set stipulations for the change in the magnetization state that is to occur on each RF pulse, such that independent desired profiles of the magnetization state result at different locations, and to apply these stipulations simultaneously. A special aspect of the inventive method is the consideration of sequence parameters in the stipulation of the magnetization change to be achieved with the spatially selective radio-frequency pulses. In this way, the temporal profile of the magnetization change can be influenced in a targeted manner. The combination of this dependence of the specified magnetization change and the use of spatially selective radio-frequency pulses makes it possible to produce the same temporal profile of the magnetization state at different locations in the object under examination despite possibly different parameters, or also to produce individual profiles of the magnetization state in a targeted manner. In this context, it should be mentioned that the term "desired profile of the magnetization state" refers to the development of the magnetization state over at least two RF pulses, but no more than over the entire experiment, and that such a desired profile can only be achieved within certain physical limits.

Within the scope of the inventive method, spatially selective radio-frequency pulses refer to radio-frequency pulses, which, due to their degrees of freedom, make it possible to implement different changes in the magnetization state simultaneously at different locations in the object. The variants used most frequently in prior art, and which can be used in the inventive method, are explained below by way of examples.

The first of the two variants is the so-called "$B_1$ tailoring," often also called "$B_1$ shimming," when it is used to produce a homogeneous $B_1$ field in certain regions of the object under examination (see Reference [2]). In $B_1$ tailoring, radio-frequency pulse waveforms are applied to an object under examination with a plurality of transmission elements of a transmission antenna device. Because each of these transmission elements has an individual $B_1$ field distribution in the region of the object, it is possible, depending on the number of transmission elements available and thus also on the given degrees of freedom, to set an individual amplitude and phase of the $B_1$ field independently within certain limits at different locations by sending the same RF waveform to each of the transmission elements, but providing them with an individual amplitude factor and phase offset. With these different $B_1$ fields it is thus possible to change the magnetization state individually at the different locations during a radio-frequency pulse. Within the scope of the invention, the term "RF pulse" always designates the totality of all RF waveforms irradiated during a certain time interval, if necessary, using multiple transmission channels and elements.

The second type of spatially selective radio-frequency pulses are the so-called spatially selective RF pulses based on additional magnetic fields (ZRSHFP) (see also Reference [3]). These are familiar to magnetic resonance imaging and are used to transfer a magnetic resonance distribution in an object under examination, which exists at a certain time, spatially dependently by the irradiation of RF pulses in combination with spatially and temporally varying additional magnetic fields, which are superimposed on the static and homogeneous basic field of the magnetic resonance device, into a new magnetization distribution, i.e. the magnetization existing at each location in the object under examination is specifically changed there or put into a state that is predefined for this location. Combination means both simultaneous irradiation of RF pulses and application of additional magnetic fields as well as the interleaved application of additional magnetic fields and RF pulses.

With ZRSHFP, spatial encoding is performed during transmission of RF pulses via the additional magnetic fields in order to implement spatial selectivity, which allows simultaneous implementation of different changes in the magnetization state at different locations of the object even though the RF pulses per se initially have no spatial selectivity. This spatial encoding during transmission must be distinguished from classic spatial encoding for acquisition, which occurs as part of data acquisition in a period after excitation without RF injection, in particular, also during data acquisition.

One application example of ZRSHFP is spatially selective excitation, which is used to produce spatially delimited transverse magnetization in an excitation volume and/or to vary spatially its amplitude and phase in accordance with predefined distributions.

In the past, ZRSHFP was initially performed using a single RF transmission antenna with an essentially homogeneous transmission field ($B_1$ field) in conjunction with the gradient system. Inspired by the success of parallel imaging in which the signal is acquired with a configuration of several RF antennas, also called antenna array in technical literature, which consists of multiple individual antennas or elements, antenna arrays consisting of multiple elements are now also being used for transmission with ZRSHFP, which are operated on several independent RF transmission channels of the MR measuring apparatus. Using this method, which is also known as "Transmit SENSE" (see also Reference [4], it is possible to partially replace spatial encoding, which is implemented in ZRSHFP analogously to data acquisition by varying additional magnetic fields, with so-called sensitivity coding and thus reduce the length of the RF pulses. This enables use of the different spatial variations of the RF transmission fields of the individual array elements, hereinafter also referred to as transmission profiles. Since the length of spatially selective RF pulses based on additional magnetic fields was usually one of the limiting criteria for the applicability of this technology in single channel transmission, Transmit SENSE is a very promising approach for using ZRSHFP on a wider scale than has been the case until now. Transmit SENSE technology is not only suitable for deflecting magnetization from the longitudinal direction and therefore for generating transverse magnetization but also for spatially selectively changing an existing magnetization state, which may already include transverse magnetization. So-called spatially selective refocusing pulses or inversion pulses are examples of pulse types that are used in such cases.

One of the basic tasks when using ZRSHFP is to determine the RF waveforms, which have to be replayed by the RF transmission system of the MR measurement apparatus to produce the desired spatially dependent change in magnetization in conjunction with additional magnetic fields. In the article "Designing Multichannel, Multidimensional, Arbitrary Flip Angle RF Pulses Using an Optimal Control Approach" (Reference [5]), Xu et al. describe a method of multiple-channel spatially dependent magnetization change with which the sought RF waveforms $B_{1,i}(t)$ can be calculated for each of the i=1 . . . N transmission channels on the basis of predefined linear additional magnetic fields. The calculation of non-linear additional magnetic fields is described, for example, in Reference [6].

The basis of the calculation methods of ZRSHFP are generally the familiar Bloch equations for describing the development of magnetization in an object during action by external magnetic fields. In Reference [5], the pulse design problem based on the Bloch equations is described as an "Optimal Control" problem, and the sought RF pulses are found by solving this problem.

In the inventive method, as described above, additional magnetic fields, which each have a spatially constant gradient in one spatial direction each across the entire measurement volume of the MR measurement apparatus, can be used both in image acquisition and in ZRSHFP for spatial encoding in magnetic resonance imaging and spatially resolved magnetic resonance spectroscopy. Because of this ability to cover the entire measurement volume, these additional magnetic fields are referred to as global gradients, and the generating system components are referred to as a global gradient system. However, so-called local gradient systems, which produce additional magnetic fields, can also be used, which have a non-linear and possibly even non-bijective profile in the region of the object under examination. Such local gradient systems can have advantages for the generation of higher additional magnetic field strengths and for the switching speed of these additional magnetic fields.

Further advantages result from the description and the drawing. Moreover, the features stated above and further below can be used inventively singly or together in any combination. The embodiments shown and described are not intended to be an exhaustive list, rather are examples to explain the invention.

The invention is shown in the drawing and is explained in more detail by way of an embodiment.

The figures show:

BRIEF DESCRIPTION OF THE DRAWING

FIG. 5 the frequency response function of the True-Fisp MR measurement sequence for different values of an RF pulse phase.

DESCRIPTION OF THE PREFERRED EMBODIMENT

Figure 1:
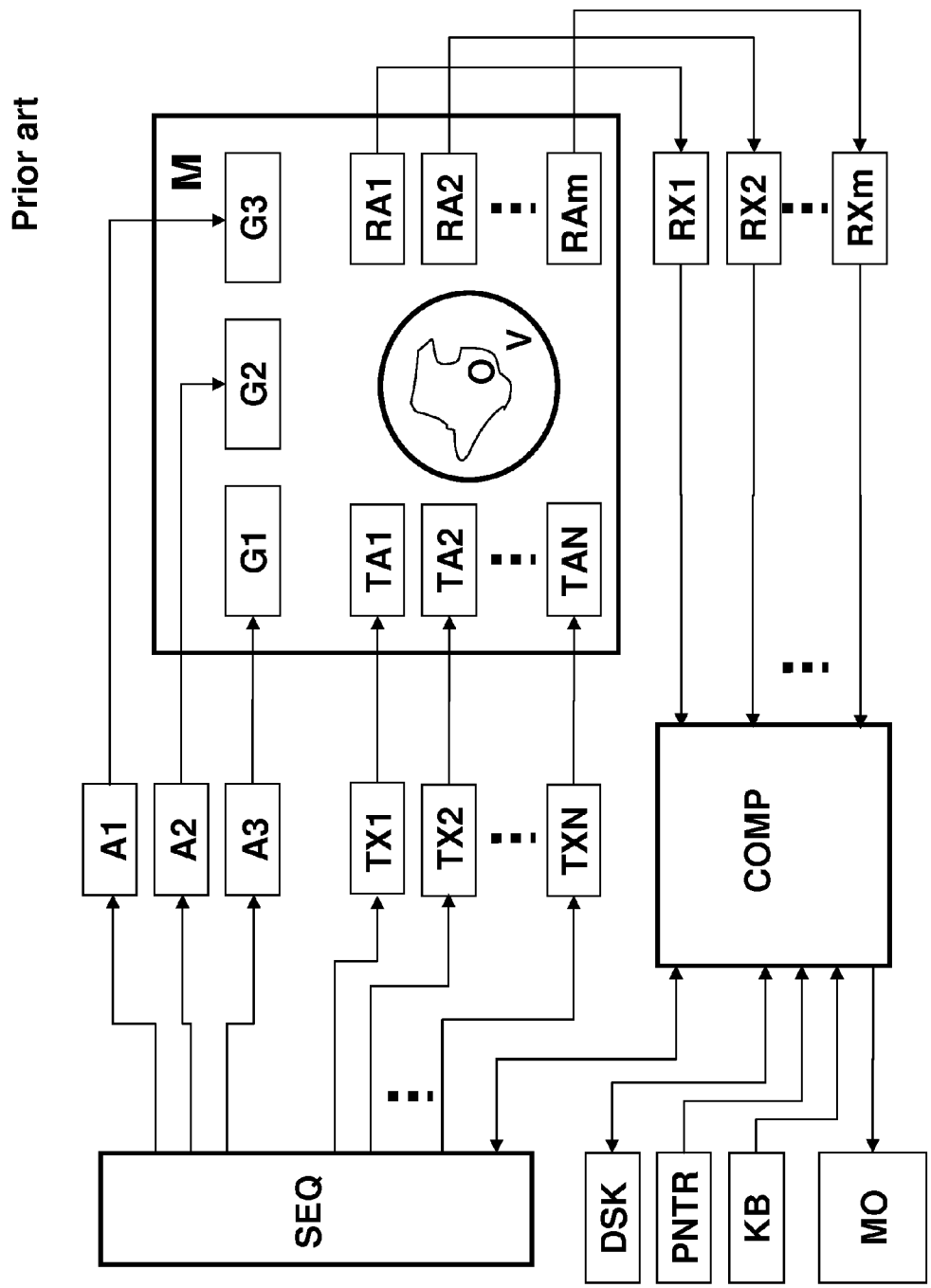
FIG. 1 a schematic representation of an MR apparatus according to prior art suitable for performing the inventive method.

FIG. 1 schematically shows an MR measurement apparatus that is suitable for performing the inventive method. The apparatus contains a main magnet M, with which the essentially homogeneous and static basic magnetic field is produced in a measurement volume V. The part of the object under examination that is contained in the measurement volume will subsequently be referred to as the object under examination or simply the object O. Surrounding the measurement volume V, a gradient system is put into the bore of the main magnet M with which different variants of additional magnetic fields can be implemented by connecting coils, usually a plurality of coils, to form coil combinations G1, G2, G3, . . . . FIG. 1 shows an example of three such coil combinations, G1, G2, and G3. With the gradient system, additional magnetic fields of controllable duration and strength can be superimposed on the basic field. With gradient amplifiers A1, A2, A3, that are controlled by a sequence control unit SEQ to produce gradient pulses at the desired time, the gradient coils sets G1, G2, and G3 are supplied with electric power to produce the additional fields.

Within the gradient field system, there are multiple transmission elements, TA1 to TAN, which are together termed the transmission antenna device. They surround an object under examination O and are powered from multiple independent RF power transmitters TX1 . . . TXN. The RF waveforms produced by these RF power transmitters TX1 . . . TXN are determined by the sequence control unit SEQ and triggered at the correct time. With the transmission elements TA1 to TAN, RF waveforms are irradiated onto the object under examination O in the volume under examination V, where they excite nuclear spins. The magnetic resonance signals caused by this are converted into electrical voltage signals with one or more RF reception elements RA1, . . . , RAm and are then fed into a corresponding number of reception units RX1, . . . , RXm. The reception elements RA1, . . . , RAm are together termed the reception antenna equipment consisting of m reception elements RA1, . . . , RAm. They are also located within the gradient coils G1, G2, G3, and surround the object under examination O.

To reduce the complexity of the apparatus, the transmission and reception antenna devices can be designed and connected in such a way that one or more of the transmission elements TA1 to TAN are also used to receive the magnetic resonance signals. In such a case, which is not shown in FIG. 1, switchover between transmission and reception modes is achieved with one or more of the electronic transmission-reception switches controlled by the sequence control unit SEQ, that is, during the RF transmission phases of the executed pulse sequence, this/these antenna(s) is/are connected to the corresponding RF power transmitter or transmitters and disconnected from the allocated reception channel or channels, while, for the reception phases, transmitter disconnection and reception channel connection is performed.

With the reception units RX1 to RXm shown in FIG. 1, the signals received are amplified and converted to digital signals using known signal processing methods and passed on to an electronic computer system COMP. In addition to reconstruction of images and spectra and derived quantities from the measured data received, the control computer system COMP is used to operate the entire MR measurement apparatus and to initiate execution of the pulse sequences by appropriate communication with the sequence control unit SEQ. User-guided or automatic execution of programs for adjusting the measurement apparatus characteristics and/or for generating magnetic resonance images is also performed by this control computer system COMP, as are visualization of the reconstructed images and storage and administration of the measurement and image data and control programs. For these tasks, this computer system is equipped with at least one processor, a working memory, a computer keyboard KB, a pointing device PNTR, for example, a computer mouse, a monitor MON, and an external digital storage unit DSK.

Figure 2:
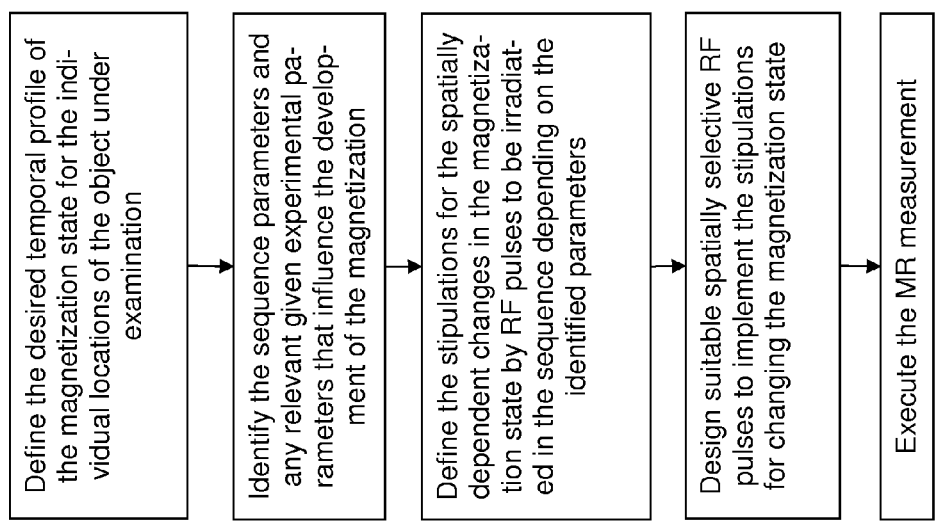
FIG. 2 a flow diagram of a possible sequence of the inventive method.

An explanation of how the inventive method can be performed with the method steps listed in FIG. 2 with such an MR measurement apparatus is given below based on specific embodiments.

Figure 3:
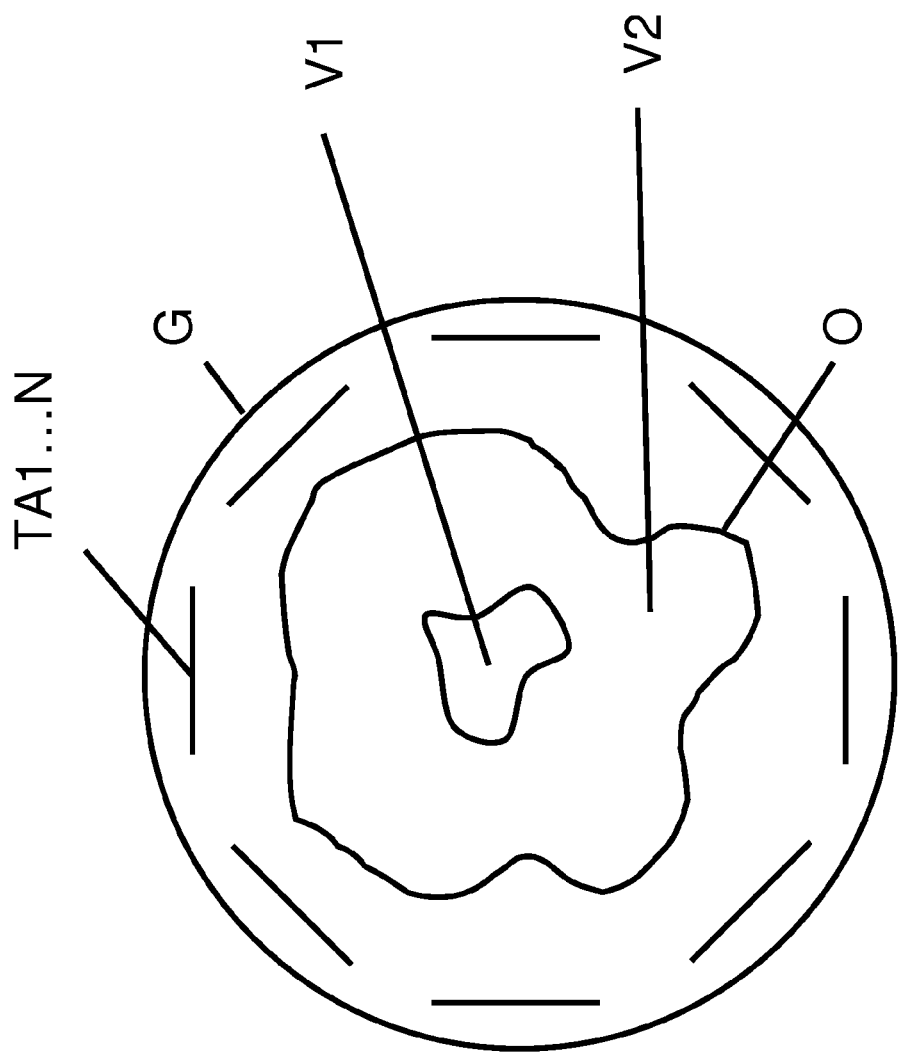
FIG. 3 two regions within the object under examination, in which differing steady states of the magnetization state can be set.
Figure 4:
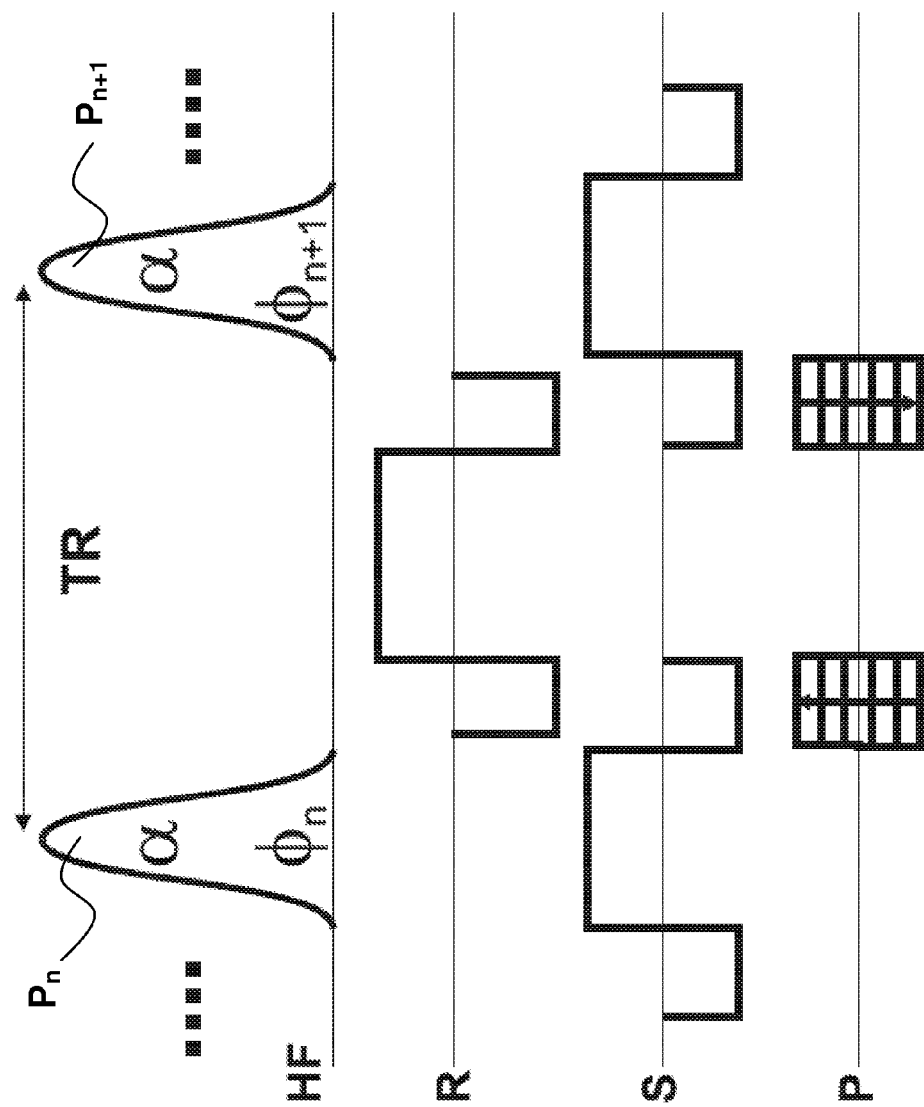
FIG. 4 the sequence diagram of a True-Fisp MR measurement sequence.

The starting point for the embodiment is an object under examination (see FIG. 3), in which, in two regions V1 and V2, a specific temporal profile of the magnetization state is to be set using (by way of example) a True-Fisp MR sequence. The sequence diagram of the True-Fisp sequence depicted in FIG. 4 shows that, per repetition time interval (TR), one RF pulse $P_n$ is injected, which rotates the magnetization on the n-th repetition through a flip angle $\alpha$ around an axis defined by the pulse phase $\Phi_n$ in the transverse plane. FIG. 5 shows the magnetization state $M(\Theta)$ that results in this sequence in the "steady state" when a so-called optimal flip angle $\alpha_{opt}$ is selected where $$\cos\alpha_{opt} \approx \frac{T_1/T_2 - 1}{T_1/T_2 + 1}$$

($T_1$ and $T_2$ describe the longitudinal and transverse relaxation time in the object under examination) in dependence on the so-called dephasing angle $\Theta$, which describes the rotation of the magnetization vector around the z axis between two consecutive pulses (e.g. due to an off resonance). The left of the two figures $M_0(\Theta)$ describes the case where all pulses are injected with phase 0, the figure on the right $M_{180}(\Theta)$ applies in the case where between two consecutive pulses, the pulse phase is incremented $\Phi$ by 180°. The curve for the magnitude of transverse magnetization $|M_{xy}|$ for any increment $\delta$ of the pulse phase $\Phi$ between two pulses is achieved by offsetting the curve for the increment 0° according to the rule $|M_{xy}|_\delta(\Theta)=|M_{xy}|_0(\Theta-\delta)$. The magnetization state shown in FIG. 5 only results after a dynamic steady state has been set. Starting out from the magnetization in the fully relaxed state before an RF pulse is applied for the first time, this steady state is usually initially set by repeatedly running the measurement sequence without data acquisition, before actual acquisition starts.

In a first case the aim is, for example, that the transverse steady-state magnetization reaches a maximum in region V1 and then disappears in region V2, wherein, in this example it must be assumed that the given experimental parameters are identical throughout the region of the object. To achieve this, the following stipulations must be made for the pulses $P_n$ as shown in FIG. 5. In region V1, the pulses must have a flip angle $\alpha_{opt}$ and a pulse phase $\Phi_n=0°$ for odd n and $\Phi_n=180°$ for even n, in region V2, $\alpha_{opt}$ must also be implemented as a flip angle but $\Phi_n=0°$ must be achieved for all n.

These stipulations can be met, for example, with $B_1$ tailoring, by selecting amplitude and phase factors for the individual transmission elements TA1-TAN for a sufficiently large number of existing degrees of freedom such that, in a first configuration in both regions, an identical amplitude and phase of the $B_1$ field of the transmission antenna device is achieved. In a second configuration, the factors are chosen such that an amplitude identical in both regions is still achieved but with a phase offset by 180° in V1. In consecutive repetitions, the same RF waveform is now injected alternately with these two transmission configurations.

Alternatively to $B_1$ tailoring, the above stipulations can also be met by means of ZRSHFP. To achieve this, suitable additional magnetic fields must first be selected and then, according to Reference [5] for example, the amplitude and phase profiles for two radio-frequency pulses to be supplied to the individual transmission elements are calculated to meet the stipulations. These two RF pulses are then injected alternately in consecutive repetitions.

If one of these two variants is now used in the experiment, the above stipulation for the RF pulses is met and the steady state occurring during the sequence produces a maximum transverse magnetization in region V1 and a disappearing transverse magnetization in region V2. This first application case is an example in which the interaction of many sequence parameters such as, for example, the strength and temporal position of the additional magnetic fields or the temporal position of the RF pulses give the sequence a complex structure, causing a specific response of the magnetization state and therefore also of the signal to be acquired in the steady state. This can then be set here in a targeted manner by selecting a desired pulse phase.

In a second application case, for example, the aim is to achieve maximum transverse magnetization in the steady state in both regions V1 and V2, even though, in this case, there is no off resonance in region V1 and an off resonance of f=100 Hz induced by the susceptibility characteristics of the object exists in region V2. For dephasing angle $\Theta$, if $\omega=2\pi f$ represents the angular frequency of the off resonance and TR, the repetition time of the sequence, then $\Theta=\omega\cdot TR$. To now achieve maximum steady-state transverse magnetization throughout the entire object, the increment $\delta$ for the phase between two consecutive pulses must be chosen as $\delta=180°$ in region V1 and as $\delta=180°+\omega\cdot TR$ in region V2. This requirement, too, can be implemented with the $B_1$ tailoring method or ZRSHFP, and presents an example in which both given experimental parameters, such as off resonance, as well as sequence parameters, such as the repetition time, are included in the stipulations for the magnetization change produced by the RF pulses.

In a third case, the maximum possible steady-state transverse magnetization is to be achieved throughout the object even though now both $T_1$ and $T_2$ are to vary across the object. However, there is no longer to be any off resonance. After determining the longitudinal and transverse relaxation times from maps according to any method known from the prior art, the optimal flip angle $\alpha_{opt}$ must now be calculated separately for every location of the object according to the above formula. This results in a stipulation for the RF pulses that the flip angle must be implemented at every location according to $\alpha_{opt}$ and that, for the entire object, the pulse phase must be incremented by 180° from pulse to pulse. If this stipulation is met using $B_1$ tailoring or ZRSHFP, the steady-state transverse magnetization is maximized in the region of the entire object. This is an example of a case in which, for each location of the object, a different stipulation based on given experimental parameters (object characteristics in this case) is required for the magnetization change produced during the RF pulses.

All variants have in common that sequence parameters are included in the stipulations for the magnetization change and that the magnetization changes are produced by injecting spatially selective pulses.

LIST OF REFERENCE SYMBOLS

A Array element
A1, A2, A3 Gradient amplifier
COMP Computer system
DSK Storage unit
G1, G2, G3 Gradient coils
KB Computer keyboard
M Main magnet
MON Screen
O Object under examination
PNTR Pointing device
$RA_{1...m}$ RF reception elements
$RX_{1...m}$ Reception units
SEQ Sequence control unit
$TA_{1...n}$ RF transmission elements
$TX_{1...n}$ RF power transmitter
V Measurement volume
V1, V2 Regions of the volume under examination

REFERENCES

[1] Oppelt A, Graumann R, Barfuß H, Fischer H, Hartl W, Schajor W. *FISP: eine neue schnelle Pulssequenz für die Kernspintomographie*. electromedica 54 (1986), pp. 15-18.

[2] Seifert F, Wuebbeler G, Junge S, Rinneberg H. B1(+) steering by an adaptive 4-channel transmit/receive coil array. Proc 12th Scientific Meeting, Intl Soc Magn Reson Med, Kyoto (2004), p. 1569

[3] Pauly J, Nishimura D, Macovski, A. *A k-space analysis of small-tip-angle excitation*. Journal of Magnetic Resonance 81 (1989), pp. 43-56.

[4] Katscher U, Börnert P, Leussler C, van den Brink J S. *Transmit SENSE*. Magnetic Resonance in Medicine 49 (2003), pp. 144-50.

[5] Xu, D, King K F, Zhu Y, McKinnon G C, Liang, Z. P. *Designing Multichannel, Multidimensional, Arbitrary Flip Angle RF Pulses Using an Optimal Control Approach*, Magnetic Resonance in Medicine 59 (2008), pp. 547-560.

[6] Haas M, Ullmann P, Schneider J T, Ruhm W, Hennig J, Zaitsev M. *Large Tip Angle Parallel Excitation Using Nonlinear Non-Bijective PatLoc Encoding Fields*. Proc 18th Scientific Meeting, Intl Soc Magn Reson Med, Stockholm (2010), p. 1569

We claim:

1. A method for generating a desired temporal profile of a magnetization state in an object under examination during an experiment involving magnetic resonance, wherein, during the experiment, the magnetization state is changed several times by means of radio-frequency pulses, with at least one sequence parameter, which influences a development of the magnetization state between two applications of radio-frequency pulses, being determined in advance, the method comprising the steps of:
   a) predefining at least one spatially dependent change in the magnetization state inside the object under examination, wherein the at least one spatially dependent change is generated by means of a radio-frequency pulse, depends on the at least one sequence parameter, is different at at least two locations and is different from zero at those locations; and
   b) irradiating spatially selective radio-frequency pulses, wherein the spatially selective radio-frequency pulses generate a simultaneous and independent change in the magnetization state at locations having different stipulations, thereby implementing the spatially dependent change in the magnetization state predefined in step a).

2. The method of claim 1, wherein irradiation of radio-frequency pulses is combined with spatially and temporally varying additional magnetic fields, which are superimposed on a static and homogeneous magnetic basic field of a magnetic resonance measurement apparatus.

3. The method of claim 1, wherein irradiation of the radio-frequency pulses is effected by means of at least two transmission elements of a transmission antenna device.

4. The method of claim 1, wherein stipulations for the spatially dependent change in the magnetization state are additionally determined by given experimental parameters.

5. The method of claim 1, wherein stipulated changes in the magnetization state are selected such that the temporal profile of the magnetization state reaches a dynamic steady state.

6. The method of claim 1, wherein the method is used as part of an MR imaging experiment.

7. The method of claim 1, wherein the method is used as part of an MR spectroscopy experiment.

* * * * *